US010310560B2

(12) United States Patent
Choi et al.

(10) Patent No.: US 10,310,560 B2
(45) Date of Patent: Jun. 4, 2019

(54) STRETCHABLE DISPLAY DEVICE AND METHOD OF MANUFACTURING STRETCHABLE DISPLAY DEVICE

(71) Applicant: SAMSUNG DISPLAY CO., LTD., Yongin-si, Gyeonggi-do (KR)

(72) Inventors: Jinwoo Choi, Yongin-si (KR); Youngse Jang, Yongin-si (KR); Haeyun Choi, Yongin-si (KR); Sungkook Park, Yongin-si (KR); Jaeik Lim, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 2 days.

(21) Appl. No.: 15/675,096

(22) Filed: Aug. 11, 2017

(65) Prior Publication Data
US 2018/0046221 A1    Feb. 15, 2018

(30) Foreign Application Priority Data

Aug. 11, 2016 (KR) .......................... 10-2016-0102240

(51) Int. Cl.
*G06F 1/16* (2006.01)
*H01L 27/32* (2006.01)
(Continued)

(52) U.S. Cl.
CPC ....... *G06F 1/1652* (2013.01); *G02B 26/0825* (2013.01); *G06F 1/1637* (2013.01);
(Continued)

(58) Field of Classification Search
CPC .......... H01L 2924/00; H01L 2924/181; H05K 1/0283; H05K 2201/0133;
(Continued)

(56) References Cited

U.S. PATENT DOCUMENTS 9,844,133 B2 * 12/2017 Tomita ................... H05K 1/038
2004/0192082 A1 * 9/2004 Wagner ................ H05K 1/0283
439/67
(Continued)

FOREIGN PATENT DOCUMENTS

| JP | 2016001457 A | 1/2016 |
| KR | 10-2014-0007560 | 1/2014 |
| KR | 10-2015-0018247 | 2/2015 |

OTHER PUBLICATIONS

Korean Notice of Allowance dated Oct. 30, 2017 for Korean Application No. 10-2016-0102240.

*Primary Examiner* — Jonathan Han
(74) *Attorney, Agent, or Firm* — F. Chau & Associates, LLC

(57) ABSTRACT

A stretchable display device includes a substrate having a plurality of islands spaced apart from each other, and a plurality of bridges connecting each of the plurality of islands. A plurality of display units is disposed above the plurality of islands, respectively. A plurality of metal wirings are electrically connected to each of the plurality of display units. The plurality of metal wirings are disposed above the plurality of bridges. Each of the plurality of bridges includes a first region curved convexly in a first direction on a plane, and a second region curved concavely in the first direction. The second region is connected to the first region. Each of the plurality of metal wirings has a first width, and each of the plurality of bridges have a second width that is greater than the first width.

21 Claims, 7 Drawing Sheets

(51) Int. Cl.
*G02B 26/08* (2006.01)
*G06F 3/041* (2006.01)
*H01L 51/00* (2006.01)
*H05B 33/14* (2006.01)
*H05B 33/22* (2006.01)

(52) U.S. Cl.
CPC .......... *G06F 3/041* (2013.01); *H01L 27/3262* (2013.01); *H01L 27/3276* (2013.01); *H01L 51/0097* (2013.01); *H05B 33/14* (2013.01); *H05B 33/22* (2013.01); *G06F 2203/04102* (2013.01); *H01L 2251/5338* (2013.01); *Y02E 10/549* (2013.01)

(58) Field of Classification Search
CPC . H05K 2201/09263; H05K 2203/0271; H05K 2201/05
USPC .............................. 174/254; 361/749; 439/67
See application file for complete search history.

(56) References Cited

U.S. PATENT DOCUMENTS

| | | |
|---|---|---|
| 2010/0143848 A1 | 6/2010 | Jain et al. |
| 2012/0051005 A1* | 3/2012 | Vanfleteren ........... H01L 21/565 361/749 |
| 2012/0250323 A1* | 10/2012 | Velu ...................... F21V 29/004 362/249.02 |
| 2014/0022746 A1 | 1/2014 | Hsu |
| 2014/0299362 A1* | 10/2014 | Park ..................... H05K 1/0283 174/254 |
| 2015/0043175 A1 | 2/2015 | Choi et al. |
| 2015/0100135 A1 | 4/2015 | Ives |
| 2015/0153862 A1 | 6/2015 | Nakamura et al. |
| 2016/0181346 A1* | 6/2016 | Kwon ................. H01L 27/3276 257/40 |

* cited by examiner

STRETCHABLE DISPLAY DEVICE AND METHOD OF MANUFACTURING STRETCHABLE DISPLAY DEVICE

CROSS-REFERENCE TO RELATED APPLICATION

This application claims the benefit of Korean Patent Application No. 10-201.6-0102240, filed on Aug. 11, 2016, in the Korean Intellectual Property Office, the disclosure of which is incorporated by reference herein in its entirety.

TECHNICAL FIELD

The present disclosure relates to a display device, and more specifically, to a stretchable display device and a method of manufacturing a stretchable display device.

DISCUSSION

Flat panel display devices are widely used owing to their small size, light weight and relatively low power consumption. Some flat panel display devices are flexible and so they can be formed into a desired shape by being bended or folded.

Some flat panel display devices may be characterized as stretchable because they may be stretched in at least one direction under certain circumstances.

SUMMARY

A stretchable display device includes a substrate having a plurality of islands spaced apart from each other, and a plurality of bridges connecting each of the plurality of islands. A plurality of display units is disposed above the plurality of islands, respectively. A plurality of metal wirings are electrically connected to each of the plurality of display units. The plurality of metal wirings are disposed above the plurality of bridges. Each of the plurality of bridges includes a first region curved convexly in a first direction on a plane, and a second region curved concavely in the first direction. The second region is connected to the first region. Each of the plurality of metal wirings has a first width, and each of the plurality of bridges have a second width that is greater than the first width.

A method of manufacturing a stretchable display device includes forming an insulating layer above a carrier substrate. A plurality of display units, spaced apart from each other, are disposed on the insulating layer. A plurality of metal wirings are disposed on the insulating layer, the metal wirings being electrically connected to the plurality of display units. The insulating layer is patterned. The plurality of display units and the plurality of metal wirings are arranged above a substrate formed by patterning the insulating layer. The substrate includes a plurality of islands above which the plurality of display units are arranged, and a plurality of bridges above which the plurality of metal wirings are arranged. Each of the bridges comprises a first region curved convexly in a first direction on a plane, and a second region curved concavely in the first direction, the second region being connected to the first region. Each of the plurality of metal wiring has a first width, and each of the plurality of bridges has a second width greater than the first width.

A display device includes a plurality of display substrates spaced apart from each other. A plurality of display units are disposed on corresponding display substrates of the plurality of display substrates. A plurality of bridges interconnects the plurality of display substrates. A plurality of wirings electrically connects the plurality of display units, Each of the plurality of wirings is disposed on a corresponding bridge of the plurality of bridges. Each of the plurality of bridges is twisted or curved.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1:
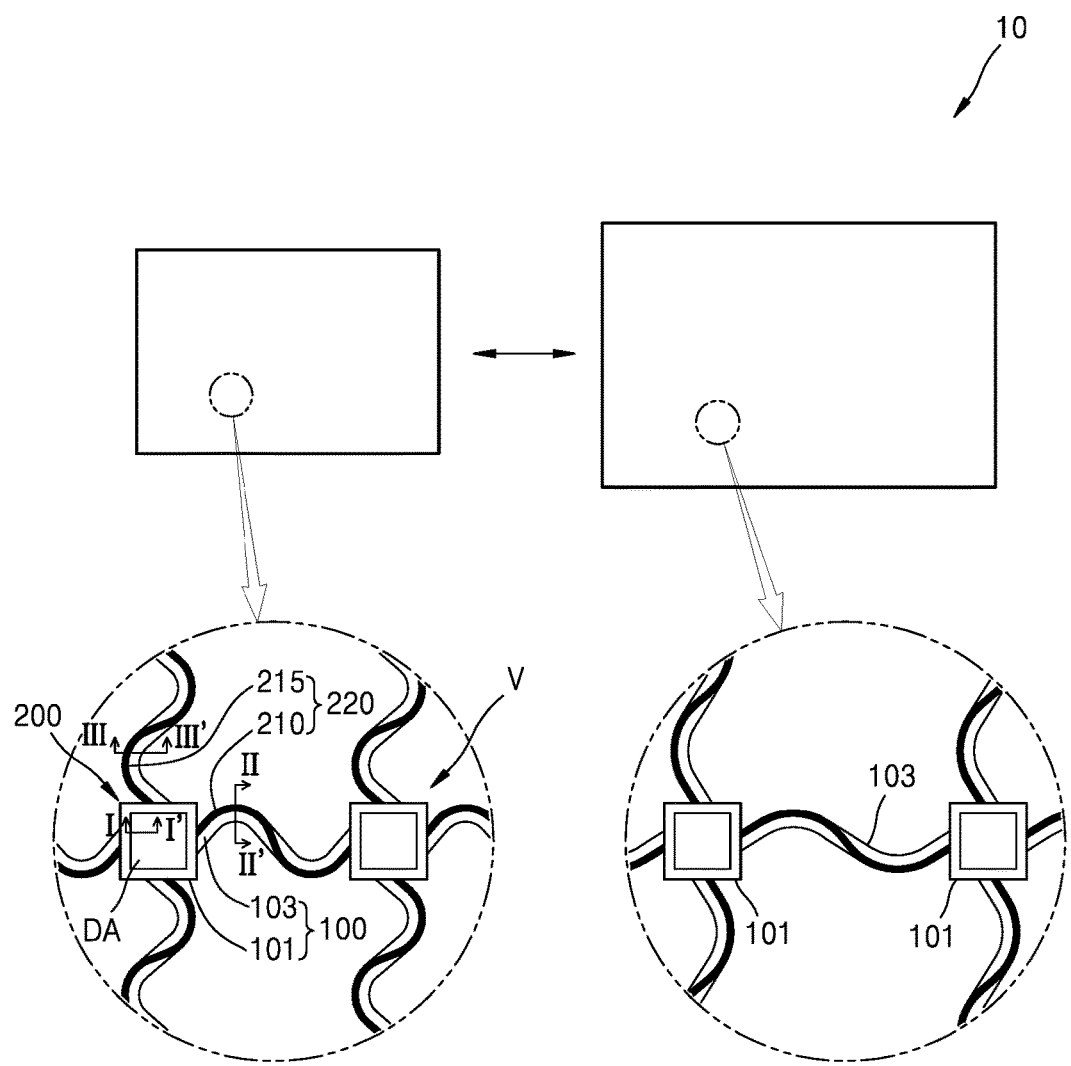
FIG. 1 is a plan view illustrating a stretchable display device according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

It will be understood that when an element is referred to as being "formed on" or "formed under" another element, it can be directly or intervening elements may be present.

Hereinafter, the inventive concept will be described more fully with reference to the accompanying drawings, in which embodiments of the inventive concept are shown. When description is made with reference to the drawings, like reference numerals in the drawings may denote like or corresponding elements, and repeated description thereof may be omitted.

Figure 2:
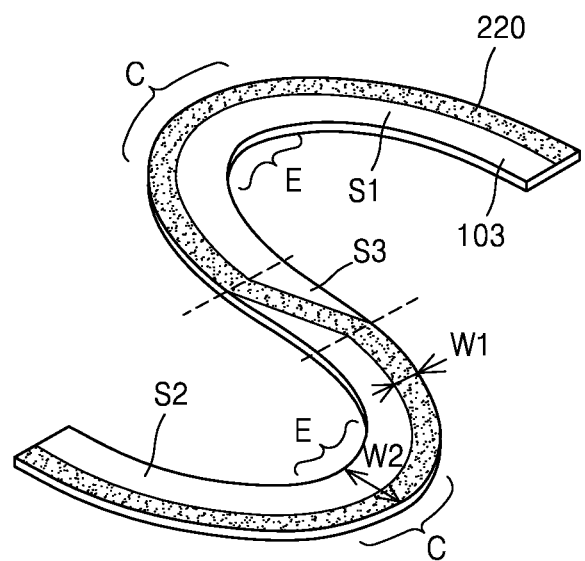
FIG. 2 is a perspective view illustrating examples of a bridge and a metal wiring of the stretchable display device of FIG. 1.
Figure 3:
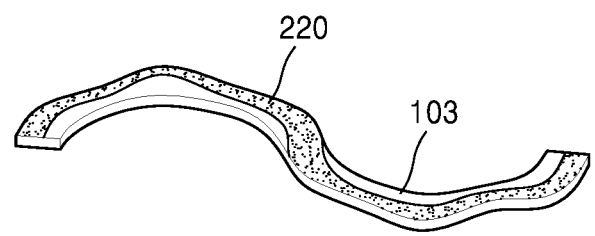
FIG. 3 is a perspective view illustrating an example of a modification to the shape of the bridge of FIG. 2.

FIG. 1 is a plan view illustrating a stretchable display device 10 according to an exemplary embodiment of the present invention. FIG. 2 is a perspective view illustrating examples of a bridge and a metal wiring of the stretchable display device of FIG. 1. FIG. 3 is a perspective view illustrating an example of a modification to the shape of the bridge of FIG. 2.

Referring to FIGS. 1 to 3, the stretchable display device 10, according to an exemplary embodiment of the present invention, may include a substrate 100, display units 200, and metal wirings 220 disposed above the substrate 100.

The substrate 100 may include a plurality of islands 101 spaced apart from each other and a plurality of bridges 103 connecting the plurality of islands 101. The plurality of islands 101 and the plurality of bridges 103 may be integrally formed. The substrate 100 may include an organic material having elasticity and ductility such as polyimide (PI). However, the substrate 100 is not limited to including polyimide and may include various other materials.

The plurality of islands 101 may be spaced apart from each other by a predetermined interval and may each have a flat upper surface. The display units 200 may be respectively disposed above the flat upper surfaces.

Each of the plurality of bridges 103 may include a first region S1 curved convexly in a first direction on a plane and a second region S2 curved convexly in a second direction, which is the opposite direction of the first direction on the same plane. The second region S2 may be connected to the first region S1. Although FIG. 2 illustrates an example in which the bridge 103 includes one first region S1 and one second region S2, the invention is not limited thereto. The bridge 103 may include at least one first region S1 and/or at least one second region S2. Where the bridge 103 includes both first and second regions S1 and S2, the first regions S1 and the second regions S2 may be alternately arranged.

The plurality of bridges 103 may change their shape and increase their length due to external force and may revert to their original shape when the external force is removed. While the curved first region S1 and second region S2 are stretched, the length of the bridge 103 may increase. Therefore, intervals between the plurality of islands 101 may be changed by the plurality of bridges 103 and thus the substrate 100 may change its shape two-dimensionally (2D) or three-dimensionally (3D).

Also, since a vacant space V is disposed between the plurality of bridges 103, the substrate 100 may have a net-like pattern and thus the substrate 100 may be highly flexible.

The plurality of islands 101 may each have a thickness greater than a thickness of each the plurality of bridges 103. Therefore, stretching of the substrate 100 may be performed by increasing the length of the plurality of bridges 103, and the shape of the plurality of islands 101 might not change in the process. Therefore, the plurality of display units 200 disposed above the plurality of islands 101 may be maintained more stably.

The metal wirings 220 may be respectively disposed above the plurality of bridges 103 and may be electrically connected to the display units 200. An insulating layer may be further disposed above the metal wirings 220 and may prevent the metal wirings 220 from being exposed. For example, the insulating layer, which may be disposed above the metal wiring 220, may have the same shape as that of the bridge 103. However, other arrangements may be used.

The metal wirings 220 may include a single layer or multiple layers. The metal wirings may include Al, Pt, Pd, Ag, Mg, Au, Ni, Nd, Ir, Cr, Li, Ca, Mo, Ti, W, and/or Cu.

The metal wiring 220 may extend in the lengthwise direction of the bridge 103, above the bridge 103. Also, the metal wiring 220 may be arranged above the bridge 103 along outer edges C having a convex shape in the first region S1 and the second region S2.

The bridge 103 increases its length while the curved first and second regions S1 and S2 are stretched. In this case, since the curvature radius of the outer edge C, having a convex shape in the first and second regions S1 and S2, is greater than the curvature radius of the inner edge E, having a concave shape on the opposite side, stress occurring when the bridge 103 stretches may be minimized at the outer edge C of the first and second regions S1 and S2. Also, while the bridge 103 stretches, compression stress is applied to the outer edge C, and tensile stress is applied to the inner edge E. Since the metal wiring 220 is arranged above the bridge 103, along the outer edge C having the convex shape in the first and second regions S1 and S2, the damage done to the metal wiring 220 by the stress may be minimized.

While the bridge 103 stretches, the greatest stress may be applied to the inner edge E having the concave shape. To prevent damage to the metal wiring 220, the metal wiring 220 may be spaced apart from the inner edge E in the first and second regions S1 and S2. For example, when the metal wiring 220 having a first width W1 is arranged above the bridge 103 along the outer edges C in the first and second regions S1 and S2, the bridge 103 may have a second width W2 greater than the first width W1 and thus the metal wiring 220 may be spaced apart from the inner edges E in the first and second regions S1 and S2. In this case, the first width W1 may be about 40% to about 70% of the second width W2.

If the first width W1 is less than about 40% of the second width W2, the bridge. 103 may be damaged and the metal wiring 220 may be severed due to heat emission by an increase in the resistance of the metal wiring 220. In contrast, if the first width W1 is greater than about 70% of the second width W2, when the bridge 103 is stretched, the metal wiring 220 may be damaged (e.g. cracked) by stress applied to the metal wiring 220.

Each of the plurality of bridges 103 may include a third region S3 connecting one end of the first region S1 to one end of the second region S2. The first region S1, the second region S2, and the third region S3 may be successively arranged.

The third region S3 of the bridge 103 is a region connecting one end of the first region S1 to one end of the second region S2, which are curved in the opposite directions, and corresponds to an inflection point of the bridge 103. The metal wiring 220 may obliquely cross the width W2 of the bridge 103 in the third region S3. Therefore, the metal wiring 220 may be successively arranged along the outer edge C having a convex shape in the first region S1 and the second region S2 which are curved in the opposite directions.

Since the bridge 103 has the width W2 greater than the width W1 of the metal wiring 220, and the metal wiring 220 is arranged along the outer edge C having the convex shape in the first region S1 and the second region S2, which are curved in the opposite directions, and is spaced apart from the inner edge E having the concave shape, while the stretchable display device 10 is stretched, stress applied to the metal wiring 220 may be minimized and also stress applied to the metal wiring 220 may be distributed by the bridge 103. Therefore, while the stretchable display device 10 is stretched, damage to the metal wiring 220 may be prevented. Meanwhile, when the bridge 103 has the width W2 greater than the width W1 of the metal wiring 220, non-uniform wrinkles may form in the bridge 103 to relieve stress generated while the stretchable display device 10 is stretched as illustrated in FIG. 3. For example, since stress may be distributed even more by changing 2D stress to 3D stress, damage to the metal wiring 220 may be more effectively prevented.

Each of the plurality of display units 200 includes a display area DA and may be electrically connected to the metal wirings 220 and may receive an electric signal. For example, the display unit 200 may include at least one organic light-emitting diode (OLED) (see FIG. 4) and at least one thin film transistor (TFT) (see FIG. 4) electrically connected to the at least one OLED (see FIG. 4). The metal wiring 220 may include a first metal wiring 210 and a second metal wiring 215 electrically connected to the TFT (see FIG. 4). However, the invention is not limited to this particular arrangement and the display unit 200 may include various kinds of display elements such as a liquid crystal element.

Figure 4:
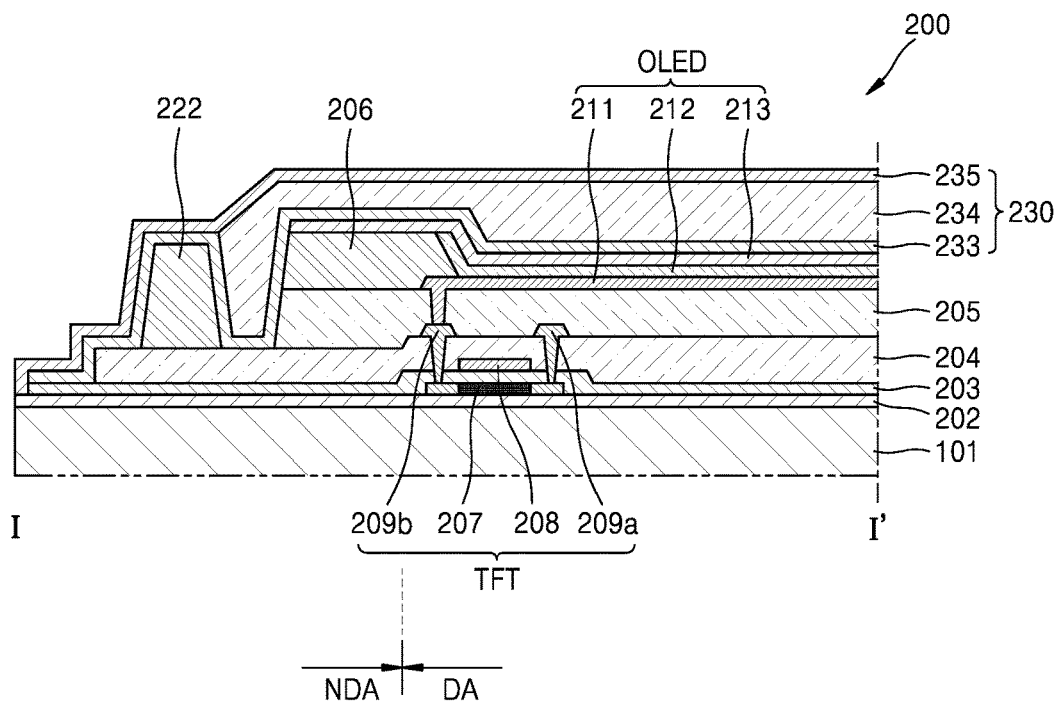
FIG. 4 is a cross-sectional view illustrating an example of the bridge and the metal wiring, taken along a line I-I' of FIG. 1.
Figure 5:
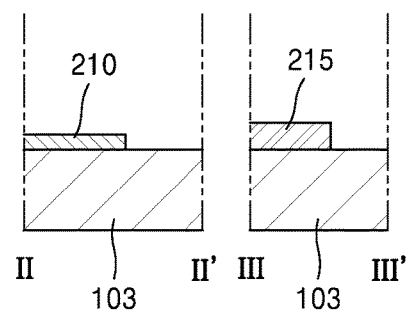
FIG. 5 is a cross-sectional view illustrating an example of the bridge and the metal wiring, taken along a line II-II' of FIG. 1 and an example of the bridge and the metal wiring, taken along a line III-III' of FIG. 1.
Figure 6:
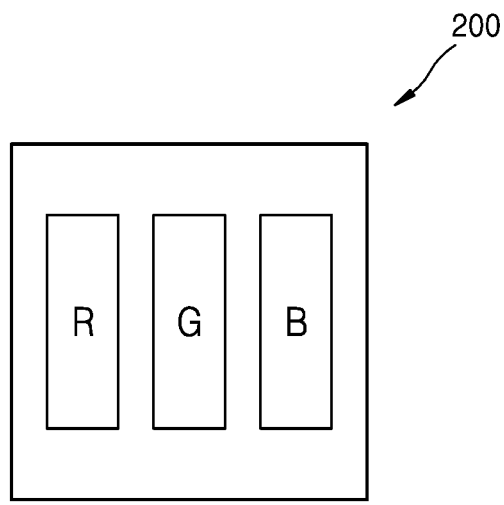
FIG. 6 is a plan view illustrating an example of a display unit of the stretchable display device of FIG. 1.
Figure 7:
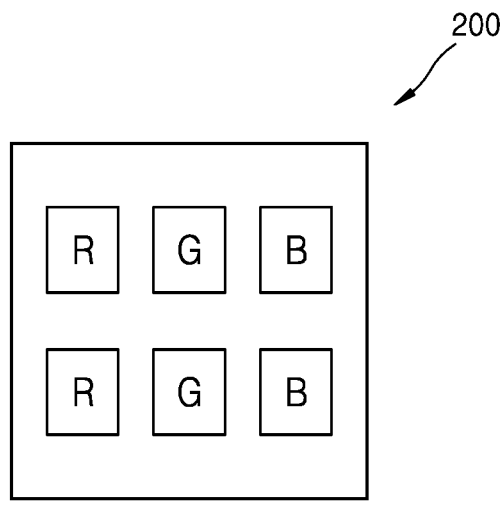
FIG. 7 is a plan view illustrating a display unit of a stretchable display device according to exemplary embodiments of the present invention.

FIG. 4 is a cross-sectional view illustrating an example of the bridge and the metal wiring, taken along a line I-I' of FIG. 1. FIG. 5 is a cross-sectional view illustrating an example of the bridge and the metal wiring, taken along a line II-II' of FIG. 1 and an example of the bridge and the metal wiring, taken along a line III-III' of FIG. 1. FIG. 6 is a plan view illustrating an example of a display unit 200 of the stretchable display device of FIG. 1. FIG. 7 is a plan view illustrating a display unit 200 of the stretchable display device according to an exemplary embodiment of the present invention.

The display unit 200 is disposed above the island 101 and may include a display area DA and a non-display area NDA outside the display area DA. For example, at least one OLED emitting red, blue, green, or white light may be arranged in the display area DA. The OLED may be electrically connected to the TFT.

Referring to FIGS. 1 and 4, a buffer layer 202 may be disposed above the island 101. The buffer layer 202 provides a flat surface above the island 101 and may include an inorganic material such as silicon oxide, silicon nitride, silicon oxynitride, aluminum oxide, aluminum nitride, titanium oxide, or titanium nitride, and/or an organic material such as PI, polyester, and/or acryl, and may include a stacked body including two or more of the above-mentioned materials.

The TFT may be disposed above the buffer layer 202. The TFT may include an active layer 207, a gate electrode 208, a source electrode 209a, and a drain electrode 209b.

The active layer 207 may include an inorganic semiconductor such as silicon or an organic semiconductor. Also, the active layer 207 includes a source region, a drain region, and a channel region therebetween. For example, in the case of forming the active layer 207 by using amorphous silicon, an amorphous silicon layer is formed above the entire surface of the island 101. A polycrystalline silicon layer is formed by crystallizing the amorphous silicon layer. The polycrystalline silicon layer is patterned. Then, a source region and a drain region in edge portions of the patterned polycrystalline silicon layer are doped with impurities, so that the active layer 207 including the source region, the drain region, and the channel region therebetween may be formed.

A gate insulating layer 203 is disposed above the active layer 207. The gate insulating layer 203 insulates the active layer 207 from the gate electrode 208 and may include an inorganic material such as SiNx and $SiO_2$.

The gate electrode 208 is disposed within a predetermined region that is above the gate insulating layer 203. The gate electrode 208 may include Au, Ag, Cu, Ni, Pt, Pd, Al, and/or Mo, and may include an alloy such as Al:Nd alloy and/or Mo:W alloy, but the gate electrode 208 is not limited to these materials and may include various other materials.

An interlayer insulating layer 204 disposed above the gate electrode 208 insulates the gate electrode 208 from the source electrode 209a and insulates the gate electrode 208 from the drain electrode 209b and may include an inorganic material such as SiNx and $SiO_2$.

The source electrode 209a and the drain electrode 209b are disposed above the interlayer insulating layer 204. The interlayer insulating layer 204 and the gate insulating layer 203 expose the source region and the drain region of the active layer 207. The source electrode 209a and the drain electrode 209b contact the exposed source region and drain region, respectively. The source electrode 209a or the drain electrode 209b may be connected to a data line.

The source electrode 209a and the drain electrode 209b may include a single layer or multiple layers such as Al, Pt, Pd, Ag, Mg, Au, Ni, Nd, Ir, Cr, Li, Ca, Mo, Ti, W, and/or Cu.

Though FIG. 4 illustrates a top-gate type TFT sequentially including the gate electrode 208, the source electrode 209a, and the drain electrode 209b, the invention is not limited to this arrangement and the gate electrode 208 may be arranged below the active layer 207.

The TFT is electrically connected to the OLED and applies a signal for driving the OLED to the OLED. Also, the TFT may be electrically connected to the first metal wiring 210 and the second metal wiring 215 and may receive a signal for driving the OLED from the first and second metal wirings 210 and 215.

As illustrated in FIG. 5, the first metal wiring 210 and the second metal wiring 215 may be disposed above the bridge 103. For example, the first metal wiring 210 may include the same material as that of the gate electrode 208. The first metal wiring 210 may apply a scan signal to the TFT. Also, the second metal wiring 215 may include the same material as that of the source electrode 209a and the drain electrode 209b and may apply a data signal to the TFT. The first metal wiring 210 and the second metal wiring 215 may be the same as the metal wiring 220 described and illustrated with reference to FIGS. 1 to 3.

The TFT may be covered with and protected by a planarization layer 205. The planarization layer 205 may be an inorganic insulating layer and/or the organic insulating layer. The inorganic insulating layer may include $SiO_2$, SiNx, SiON, $Al_2O_3$, $TiO_2$, $Ta_2O_5$, $HfO_2$, $ZrO_2$, BST, PZT, etc. The organic insulating layer may include a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof. Also, the planarization layer 205 may include a composite stacked body including the inorganic insulating layer and the organic insulating layer.

The OLED may be disposed above the planarization layer 205. The OLED may include a first electrode 211, an intermediate layer 212, and a second electrode 213.

The first electrode 211 is disposed above the planarization layer 205 and is electrically connected to the source electrode 209a and the drain electrode 209b via contact holes in the planarization layer 205.

The first electrode 211 may be a reflective electrode and may include a reflective layer including Ag, Mg, Al, Pt, Pd, Au, Ni, Nd, Ir, Cr, and/or a compound thereof. A transparent or semi-transparent electrode layer is disposed above the reflective layer. The transparent or semi-transparent electrode layer may include indium tin oxide (ITO), indium zinc oxide (IZO), zinc oxide (ZnO), indium oxide ($In_2O_3$), indium gallium oxide (IGO), and/or aluminum zinc oxide (AZO).

The second electrode 213 may face the first electrode 211. The second electrode 213 may be a transparent or semi-transparent electrode and may include a metallic thin film having a small work function and including Li, Ca, LiF/Ca, LiF/Al, Al, Ag, Mg, and/or a compound thereof. Also, an auxiliary electrode layer or a bus electrode including a material for forming a transparent electrode such as ITO, IZO, ZnO, or $In_2O_3$ may be further disposed above the metallic thin film.

The second electrode 213 may transmit light emitted from an organic emission layer of the intermediate layer 212. For example, the light emitted from the organic emission layer may be directly emitted toward the second electrode 213 or reflected by the first electrode 211, including the reflective electrode, and emitted toward the second electrode 213.

However, the display unit 200 is not limited to a top-emission type display unit and may be a bottom-emission type display unit in which the light emitted from the organic emission layer is emitted toward the island 101. In this case, the first electrode 211 may be a transparent or semi-transparent electrode, and the second electrode 213 may be a reflective electrode. Also, the display unit 200 may be a dual-emission type display unit which emits light in two directions including a front direction and a bottom direction.

A pixel-defining layer 206, including an insulating material, is disposed above the first electrode 211. The pixel-defining layer 206 may include an organic insulating material including PI, polyamide, an acrylic resin, benzocyclobutene (BCB), and/or a phenol resin, and may be formed by spin coating, etc. The pixel-defining layer 206 exposes a predetermined region of the first electrode 211. The intermediate layer 212 including the organic emission layer is arranged in the exposed region.

The organic emission layer of the intermediate layer 212 may include a low molecular organic material or a polymer organic material. The intermediate layer 212 may further include a functional layer such as a hole transport layer (HTL), a hole injection layer (HIL), an electron transport layer (ETL), and an electron injection layer (EIL) in addition to the organic emission layer.

A thin film encapsulation layer 230 may seal the display unit 200. The thin film encapsulation layer 230 may be disposed above the second electrode 213. The thin film encapsulation layer 230 may block external oxygen or moisture from penetrating to the other layers. The thin film encapsulation layer 230 may include a single layer or multiple layers.

For example, the thin film encapsulation layer 230 may include one or more inorganic layers 233 and 235 and at least one organic layer 234, alternately stacked. Though FIG. 4 illustrates an example in which the thin film encapsulation layer 230 includes two inorganic layers 233 and 235 and one organic layer 234, other layers may be present. For example, the thin film encapsulation layer 230 may further include a plurality of inorganic layers and organic layers alternately arranged. There may be any number of stacked inorganic or organic layers.

The inorganic layers 233 and 235 may include silicon nitride, an aluminum nitride, a zirconium nitride, a titanium nitride, a hafnium nitride, a tantalum nitride, a silicon oxide, an aluminum oxide, a titanium oxide, a tin oxide, a cesium oxide, and/or a silicon oxynitride (SiON).

The organic layer 234 planarizes a step difference by the pixel-defining layer 206 and may relieve stress occurring at the inorganic layers 233 and 235. The organic layer 234 may include PMMA, polycarbonate (PC), PS, an acryl-based resin, an epoxy-based resin, PI, polyethylene, etc.

The inorganic layers 233 and 235 may have an area greater than that of the organic layer 234. Therefore, the inorganic layers 233 and 235 may contact each other beyond the organic layer 234 and thus more effectively prevent penetration of external oxygen or moisture.

The thin film encapsulation layer 230 may be disposed above each of the plurality of display units 200 independently. For example, in the case where the stretchable display device 10 (of FIG. 1) includes n display units 200, where n is a positive integer, the thin film encapsulation layers 230 may include n thin film encapsulation layers 230.

A protective layer for protecting the OLED and a functional layer such as a touch layer may be further disposed above the thin film encapsulation layer 230. The protective layer may include a hard coating layer, for example, or include a buffer layer which may absorb external impact, etc.

A dam portion 222 surrounding at least a portion of the display area DA may be in the non-display area NDA of the display unit 200.

The dam portion 222 may prevent the edge tail of the organic layer 234 from being formed by blocking an organic material for forming the organic layer 234 flowing in the edge direction of the island 101 when forming the organic layer 234 of the thin film encapsulation layer 230. Therefore, the organic layer 234 may face or contact the inner surface of the dam portion 222. For example, the organic layer 234 may partially overlap the dam portion 222 but does not extend to the outside of the dam portion 222.

In contrast, the inorganic layers 233 and 235 may cover the dam portion 222, and the end of the inorganic layers 233 and 235 may be arranged closer to the edge of the island 101 than the dam portion 222. Therefore, the edge of the inorganic layers 233 and 235 may be prevented from peeling off and an encapsulation characteristic of the thin film encapsulation layer 230 may be prevented from being weakened and removed in the non-display area NDA.

The dam portion 222 may include the same material as that of at least one of layers ranging from the gate insulating layer 203 to the pixel-defining layer 206.

For example, the dam portion 222 may include a first layer including the same material as that of the planarization layer 208, and a second layer including the same material as that of the pixel-defining layer 206 above the first layer. However, the arrangement of the dam portion 222 is not limited thereto and the dam portion 222 may include one layer. Also, the dam portion 222 may include a plurality of layers. In the case where the dam portion 222 includes the plurality of layers, the height of the dam portion 222 may increase toward the outer portion of the island 101.

The display unit 200 may include one OLED emitting red, blue, green, or white light. Alternatively, the display unit 200 may include a plurality of OLEDs emitting different light. For example, as illustrated in FIG. 6, the display unit 200 may include one pixel including an OLED emitting red (R) light, an OLED emitting green (G) light, and an OLED emitting blue (B) light. Though FIG. 6 illustrates an example in which the OLEDs are arranged in an RGB configuration, the OLEDs may be arranged in other patterns such as in a pantile structure, a honeycomb structure, etc. depending on the efficiency of a material of the organic emission layer.

For example, the display unit 200 may include a plurality of pixels. Though FIG. 7 illustrates an example in which the display unit 200 includes two pixels arranged in an RGB configuration, other arrangements may be used. For example, the display unit 200 may include a plurality of pixels in which OLEDs are arranged in a pantile structure, a honeycomb structure, etc.

Figure 8:
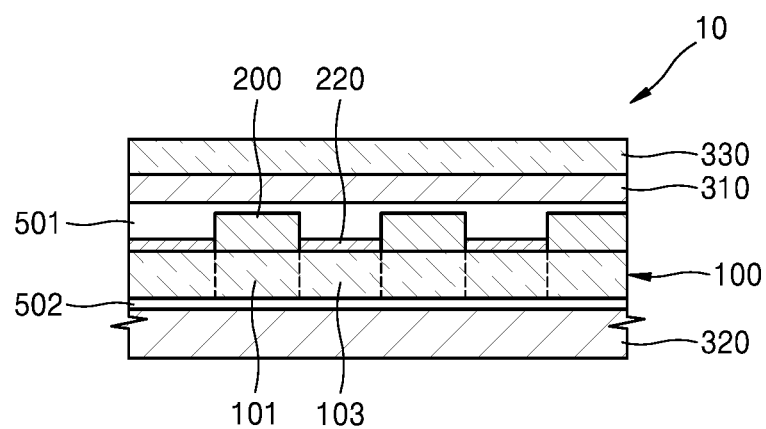
FIG. 8 is a cross-sectional view illustrating a modified example of the stretchable display device of FIG. 1.
Figure 9:
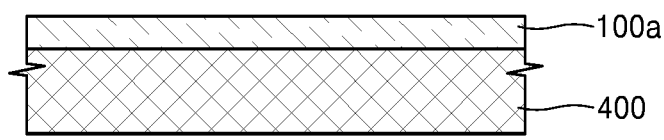
FIGS. 9 to 13 are views illustrating a method of manufacturing the stretchable display device of FIG. 1 according to exemplary embodiments of the present invention.

FIG. 8 is a cross-sectional view of a modified example of the stretchable display device of FIG. 1.

Referring to FIG. 8, the stretchable display device 10 may include the substrate 100. The substrate may include a plurality of islands 101 spaced apart from each other, and a plurality of bridges 103 connecting the plurality of islands 101. The plurality of display units 200 are disposed above the plurality of islands 101, respectively. The plurality of metal wirings 220 are disposed above the plurality of bridges 103, respectively. The plurality of metal wirings 220 are electrically connected to the plurality of display units 200, respectively. Since the substrate 100, the display units 200, and the metal wirings 220 are similar to those illustrated and described with reference to FIGS. 1 to 7, repeated descriptions thereof are omitted.

The stretchable display device 10 of FIG. 8 may include a first protective film 310 disposed above the plurality of display units 200 and the metal wirings 220, and a functional layer 330 disposed above the first protective film 310. The stretchable display device 10 may further include a second protective film 320 attached to the lower surface of the substrate 100.

The first protective film 310 and the second protective film 320 may prevent external foreign substances such as moisture and oxygen, etc. from penetrating into the stretchable display device 10. The first protective film 310 and the second protective film 320 may be attached to the thin film encapsulation layer 230 (of FIG. 4) and the substrate 100 by using a first adhesive layer 501 and a second adhesive layer 502, respectively.

The first protective film 310 and the second protective film 320 may include a stretched sheet and thus may both be stretched when the stretchable display device 10 is stretched. For example, the first protective film 310 and the second protective film 320 may include polydimethylsiloxane (PDMS) but other materials may be used.

The functional layer 330 may include a polarization layer and/or a touchscreen layer. Also, the functional layer 330 may further include an optical film for reflecting external light, a protective layer, etc. The functional layer 330 is stretchable and may be stretched along with the stretchable display device 10.

FIGS. 9 to 13 are views illustrating a method of manufacturing the stretchable display device of FIG. 1.

Referring to FIGS. 9 to 13, the method of manufacturing the stretchable display device may include forming an insulating layer 100a above a carrier substrate 400. The plurality of display units 200 are spaced apart from each other and the plurality of metal wirings 220 are electrically connected to the plurality of display units 200, above the insulating layer 100a. The insulating layer 100a is patterned.

The insulating layer 100a may be formed by forming an organic material having elasticity and ductility, such as PI, above the carrier substrate 400 using a method such as spin coating, printing, etc.

The plurality of display units 200 and the plurality of metal wirings 220 are disposed above the substrate 100. The substrate 100 is formed by patterning the insulating layer 100a. The substrate 100 may include the plurality of islands 101 above which the plurality of display units 200 are disposed, and the plurality of bridges 103 above which the plurality of metal wirings 220 are disposed.

Forming the substrate 100 by patterning the insulating layer 100a and forming the display units 200 and the metal wirings 220 may be performed in any sequence.

For example, after forming the substrate 100 by patterning the insulating layer 100a first, the plurality of display units 200 and the plurality of metal wirings 220 may be formed above the patterned substrate 100. Alternatively, after forming the plurality of display units 200 and the plurality of metal wirings 220 above the insulating layer 100a, the substrate 100 may be formed by patterning the insulating layer 100a.

Figure 10:
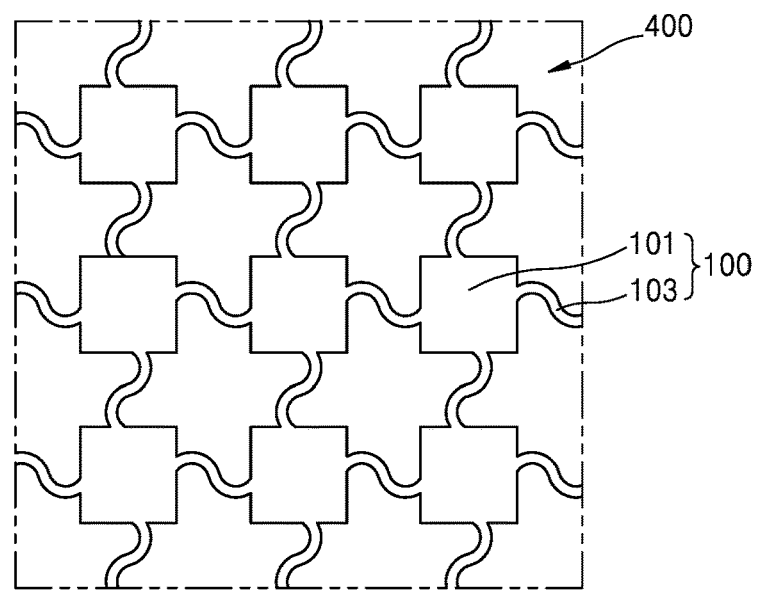
Figure 11:
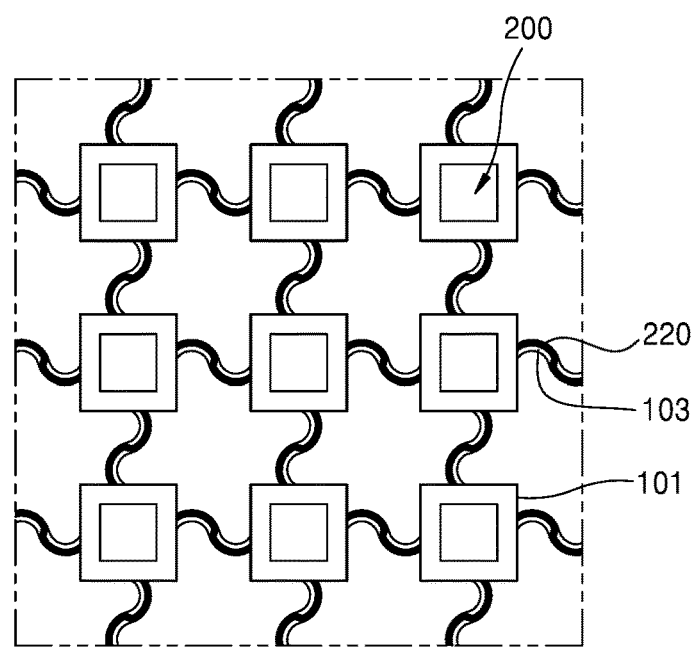

The patterned substrate 100 may include the plurality of islands 101 and the plurality of bridges 103, as illustrated in FIG. 10. A lower portion of the carrier substrate 400 may be exposed in a region in which the insulating layer 100a has been removed. The patterning of the insulating layer 100a may be performed by wet etching or dry etching.

The plurality of islands 101 may be spaced apart from each other by a predetermined interval and may include a flat upper surface. The display unit 200 may be formed above the flat upper surface.

Each of the plurality of bridges 103 may include a first region curved convexly in a first direction on a plane, a second region curved convexly in a second direction, which is the opposite direction of the first direction on the same plane (i.e. curved concavely in the first direction), the second region being connected to the first region, and a third region being disposed between the first region and the second region. Therefore, the plurality of bridges 103 may increase their length elastically while changing their shape due to force applied thereto.

The metal wirings 220 disposed above the plurality of bridges 103 may be arranged along the outer edge having a convex shape in the first region and the second region of the bridge 103 and spaced apart from the inner edge. Also, the metal wiring 220 may have a width ranging from about 40% to about 70% of the width of the bridge 103 and may obliquely cross the width of the bridge 103 in the third region.

Each of the plurality of display units 200 may include the TFT (see FIG. 4), and the metal wiring 220 may be electrically connected to the TFT (see FIG. 4). For example, some of the metal wirings 220 may be connected to the gate electrode of the TFT (see FIG. 4) and may apply a scan signal to the gate electrode. Other metal wirings 220 may be connected to the source electrode of the TFT (see FIG. 4) and may apply a data signal to the source electrode.

The metal wiring 220 applying a scan signal may include the same material as that of the gate electrode 208 (see FIG. 4) and may be formed simultaneously with the gate electrode 208. Also, the metal wiring 220 applying a data signal may include the same material as those of the source electrode 209a (see FIG. 4) and the drain electrode 209b (see FIG. 4) and may be formed simultaneously with the source electrode 209a and the drain electrode 209b.

The thin film encapsulation layer 230 (see FIG. 4) seals the plurality of display units 200 respectively formed above the plurality of islands 101. For example, the thin film encapsulation layer 230 (see FIG. 4) may be respectively formed above the plurality of display units 200 independently. Thus, there may be a separate thin film encapsulation layer 230 disposed over each of the plurality of display units. Also, the second electrode 213 (see FIG. 4) may be separately formed in each pixel P, and an additional metal layer for electrically connecting the divided second electrodes 212 (see FIG. 4) may be further formed. The additional metal layer connected to the second electrode 213 (see FIG. 4) may be formed above an added bridge 103 and may include the same material as that of the second electrode 213 (see FIG. 4) and may be formed simultaneously with the second electrode 213.

Figure 12:
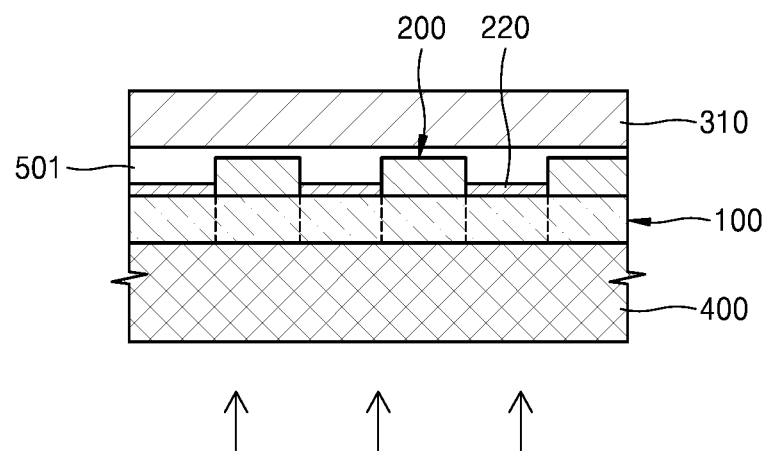

Subsequently, as illustrated in FIG. 12, the first protective film 310 is attached above the thin film encapsulation layer 230 (see FIG. 4), and the carrier substrate 400 is removed.

The first protective film 310 may include a stretched sheet and may be attached to the thin film encapsulation layer 230 (see FIG. 4) by using the first adhesive layer 501. For example, the first protective film 310 may include polydimethylsiloxane (PDMS).

The carrier substrate 400 may be separated from the substrate 100 by using a physical or chemical method. For example, the carrier substrate 400 may be separated in a laser-lift-off (LLO) method.

Figure 13:
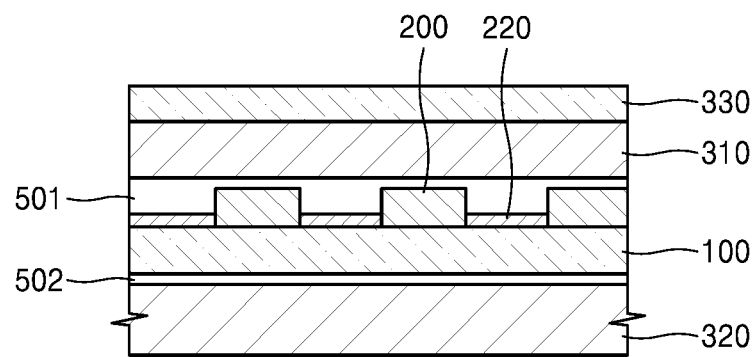

Next, as illustrated in FIG. 13, the second protective film 320 is attached to the lower surface of the substrate 100 from which the carrier substrate 400 has been separated. The functional layer 330 is formed above the first protective film 310.

The second protective film 320 may include PDMS. The functional layer 330 may include a stretchable polarization layer and/or a stretchable touchscreen layer.

Though the inventive concept has been described with reference to the exemplary embodiments illustrated in the drawings, it will be understood by those of ordinary skill in the art that various changes in form and details and equivalents thereof may be made therein without departing from the spirit and scope of the inventive concept.

What is claimed is:

1. A stretchable display device comprising:
   a substrate comprising a plurality of islands spaced apart from each other, and a plurality of bridges connecting each of the plurality of islands;
   a plurality of display units disposed above the plurality of islands, respectively; and
   a plurality of metal wirings electrically connected to each of the plurality of display units, the plurality of metal wirings being disposed above the plurality of bridges,
   wherein each of the plurality of bridges comprises a first region curved convexly in a first direction on a plane, and a second region curved concavely in the first direction, the second region being connected to the first region,
   wherein each of the plurality of metal wirings has a first width, and each of the plurality of bridges have a second width that is greater than the first width, and
   wherein each of the plurality of display units comprises a display area, a non-display area that is outside of the display area, and a dam portion arranged within the non-display area, the dam portion surrounding the display area.

2. The stretchable display device of claim 1, wherein each of the plurality of metal wirings is arranged along an outer edge having a convex shape in the first region and the second region, and is spaced apart from an inner edge having a concave shape in the first region and the second region.

3. The stretchable display device of claim 2, wherein the first width is from about 40% to about 70% of the second width.

4. The stretchable display device of claim 2, wherein each of the plurality of bridges comprises a third region connecting one end of the first region to one end of the second region above the plane, and a corresponding metal wiring of the plurality of metal wirings obliquely crosses a width of the bridge in the third region.

5. The stretchable display device of claim 4, wherein the first region, the second region, and the third region are sequentially arranged.

6. The stretchable display device of claim 1, wherein each of the plurality of display units comprises at least one organic light-emitting diode emitting red light, blue light, green light, or white light.

7. The stretchable display device of claim 6, wherein each of the plurality of display units comprises at least one pixel, and the at least one pixel comprises a red organic light-emitting diode emitting the red light, a blue organic light-emitting diode emitting the blue light, and a green organic light-emitting diode emitting the green light.

8. The stretchable display device of claim 7, wherein the at least one pixel comprises a plurality of pixels.

9. The stretchable display device of claim 6, wherein each of the plurality of display units comprises at least one thin film transistor electrically connected to the at least one organic light-emitting diode, and the plurality of metal wirings comprise a first metal wiring and a second metal wiring each of which is electrically connected to the at least one thin film transistor.

10. The stretchable display device of claim 9, wherein the at least one thin film transistor comprises an active layer, a gate electrode, a source electrode, and a drain electrode, the first metal wiring is connected to the gate electrode, and the second metal wiring is connected to the source electrode.

11. The stretchable display device of claim 10, wherein the first metal wiring comprises a same material as that of the gate electrode, and the second metal wiring comprises a same material as that of the source electrode and the drain electrode.

12. The stretchable display device of claim 1, further comprising: a thin film encapsulation layer disposed above the plurality of display units, the thin film encapsulation layer sealing the plurality of display units.

13. The stretchable display device of claim 12, wherein the thin film encapsulation layer is separately arranged above each of the plurality of display units.

14. The stretchable display device of claim 12, wherein the thin film encapsulation layer comprises at least one organic layer and at least one inorganic layer.

15. The stretchable display device of claim 14, wherein the at least one inorganic layer has an area greater than that of the at least one organic layer, and the at least one inorganic layer covers the dam portion.

16. The stretchable display device of claim 1, further comprising: a first protective filial disposed above the plurality of display units, and a second protective film disposed on a bottom surface of the substrate, the first protective film and the second protective film comprising a stretched sheet.

17. The stretchable display device of claim 16, further comprising: a functional layer disposed above the first protective film, the functional layer comprising a polarization layer or a touchscreen layer.

18. A display device, comprising:
   a plurality of display substrates spaced apart from each other;
   a plurality of display units, each of the plurality of display units being disposed on a corresponding display substrate of the plurality of display substrates;
   a plurality of bridges interconnecting the plurality of display substrates; and
   a plurality of wirings electrically connecting the plurality of display units, each of the plurality of wirings being disposed on a corresponding bridge of the plurality of bridges,
   wherein each of the plurality of bridges is twisted or curved, and wherein each of the plurality of display units comprises a display area, a non-display area that is outside of the display area, and a dam portion arranged within the non-display area, the dam portion surrounding the display area.

19. The display device of claim 18, wherein each of the plurality of bridges comprises a first region curved convexly and a second region curved concavely, the second region being connected to the first region.

20. The display device of claim 18, wherein each of the plurality of metal wirings has a first width, and each of the plurality of bridges have a second width that is greater than the first width.

21. The display device of claim 18, wherein the display device comprises a plurality of pixels and each of the plurality of display units includes a distinct subset of the plurality of pixels.

* * * * *